United States Patent [19]
McGinn

[11] Patent Number: 4,739,284
[45] Date of Patent: Apr. 19, 1988

[54] PHASE LOCKED LOOP HAVING FAST FREQUENCY LOCK STEERING CIRCUIT

[75] Inventor: Michael McGinn, Scottsdale, Ariz.
[73] Assignee: Motorola, Inc., Schaumburg, Ill.
[21] Appl. No.: 45,500
[22] Filed: May 4, 1987
[51] Int. Cl.$^4$ ............................................. H03D 3/18
[52] U.S. Cl. ..................... 331/1 A; 329/124; 375/39
[58] Field of Search .................. 331/1 A, 12, 17, 25; 329/122, 124; 375/39, 81, 120

[56] References Cited

U.S. PATENT DOCUMENTS 4,580,101 4/1986 Lax ................................. 329/124 X
4,605,903 8/1986 Ihle ................................. 329/124 X Primary Examiner—Eugene R. LaRoche
Assistant Examiner—Robert J. Pascal
Attorney, Agent, or Firm—Michael D. Bingham

[57] ABSTRACT

A steering circuit for use with a phase locked loop (PLL) includes a D-type flip flop having data and clock input terminals and first and second output terminals at which are produced complementary logic output signals, and first and second current sources having inputs respectively coupled to the first and second outputs of the flip flop and outputs connected to an output of the steering circuit. The steering circuit is responsive to error beat note signals generated by the PLL for either sourcing or sinking first and second currents at the output thereof depending upon whether the input signal frequency to the PLL is greater or less than the oscillation frequency of the voltage controlled oscillator (VCO) of the PLL. The output of the steering circuit is connected to the control input terminal of the VCO such that the latter is driven to lock.

10 Claims, 3 Drawing Sheets

FIG. 1  *-PRIOR ART-*

PHASE LOCKED LOOP HAVING FAST FREQUENCY LOCK STEERING CIRCUIT

BACKGROUND OF THE INVENTION

Most, if not all, modern Phase Locked Loop (PLL) systems having low loop bandwidths require some circuit means of ensuring fast lock-up on application of an applied signal to prevent excessive acquisition times. In addition to reducing lock up time these fast lock circuit means normally enable the PLL to acquire lock even when the error frequency is many times greater than the loop bandwidth. The most common technique used to decrease lock up time is to increase loop gain when the system is out of lock. Increasing the loop gain increases the loop bandwidth and hence decreases lock up time. This technique suffers in that loop gain can only be increased to the point where loop instability becomes a problem.

In an attempt to overcome the above described problem a PLL system was developed utilizing a pair of phase detectors for generating quadrature phase related beat notes from the applied input signal. The beat notes are used in combination with a RS latch circuit to generate a square wave at the output of the RS latch circuit. This square wave is out of phase with the beat note generated from the reference one of the pair of detectors when the frequency of the input signal is greater than the Voltage Controlled Oscillator (VCO) frequency and is in phase when the input signal frequency is below the VCO frequency. In this manner the appropriate half of the reference phase detector output current is increased in such a way that the PLL is driven towards lock. A PLL of this type is used in the MC13020 AM Stereo Decoder Integrated Circuit manufactured by Motorola, Inc. The MC13020 PLL is described in more detail with reference to FIG. 1 herein. Although the MC13020 PLL performs quite well it also suffers from system problems. For instance, the lock up time is still limited by loop stability considerations. Further, the circuit paths between the two phase detectors and the RS latch circuit are dissimilar and therefore have different signal delays therebetween. This sets a limit to the maximum error in frequency between the input signal and the VCO signal that the PLL can handle since at higher frequency beat notes the input signals to the RS latch circuit are no longer in phase quadrature.

Thus, there is a need for an improved PLL system having fast lockup circuitry which overcomes the problems associated with prior art PLL.

SUMMARY OF THE INVENTION

Accordingly it is an object of the present invention to provide an improved phase locked loop (PLL).

It is another object of the present invention to provide a circuit for producing an output signal indicative of the relative phase of a pair of signals supplied to respective inputs thereof.

Still another object of the present invention is to provide a steering circuit for a phase locked loop for driving the voltage controlled oscillator of the PLL to lock.

In accordance with the above and other objects there is provided a circuit that is responsive to a pair of applied input signals for producing an output signal at a circuit output indicative of the phase relation between the pair of input signals, which comprises a D-type flip flop having data and clock inputs to which the pair of input signals are respectively applied and first and second outputs at which are provided complementary output logic signals, a first current source coupled between said first output of said D-type flip flop and the circuit output for sourcing current to said circuit output when rendered conductive by said logic output signal being in a first level state and being rendered non-conductive in response to said logic output signal being in a second level state; and a second current source coupled between said second output of said D-type flip flop and the circuit output for sinking a current therefrom when rendered conductive by said logic output signal being in said first level state and being rendered non-conductive in response to said output logic signal being in said second level state.

It is a feature of the present invention that the above described circuit is utilized in combination with a phase locked loop (PLL) to provide steering current to the voltage controlled oscillator (VCO) of the PLL to drive the VCO to lock. The PLL, as known, comprises a pair of phase detectors operated in phase quadrature with respect to the VCO signal applied to inputs thereof and both receive the applied input signal. The circuit of the present invention is coupled between the outputs of the phase detectors and the control input terminal of the VCO and is responsive to error beat note signals generated by the phase detectors whenever the frequency of the input signal differs from the frequency of the VCO to provide feedback to the control input terminal of the latter. In this way the output frequency of the VCO is driven in such a manner to cause the PLL to lock to the input signal.

DETAILED DESCRIPTION OF THE PREFERRED EMBODIMENT

Figure 1:
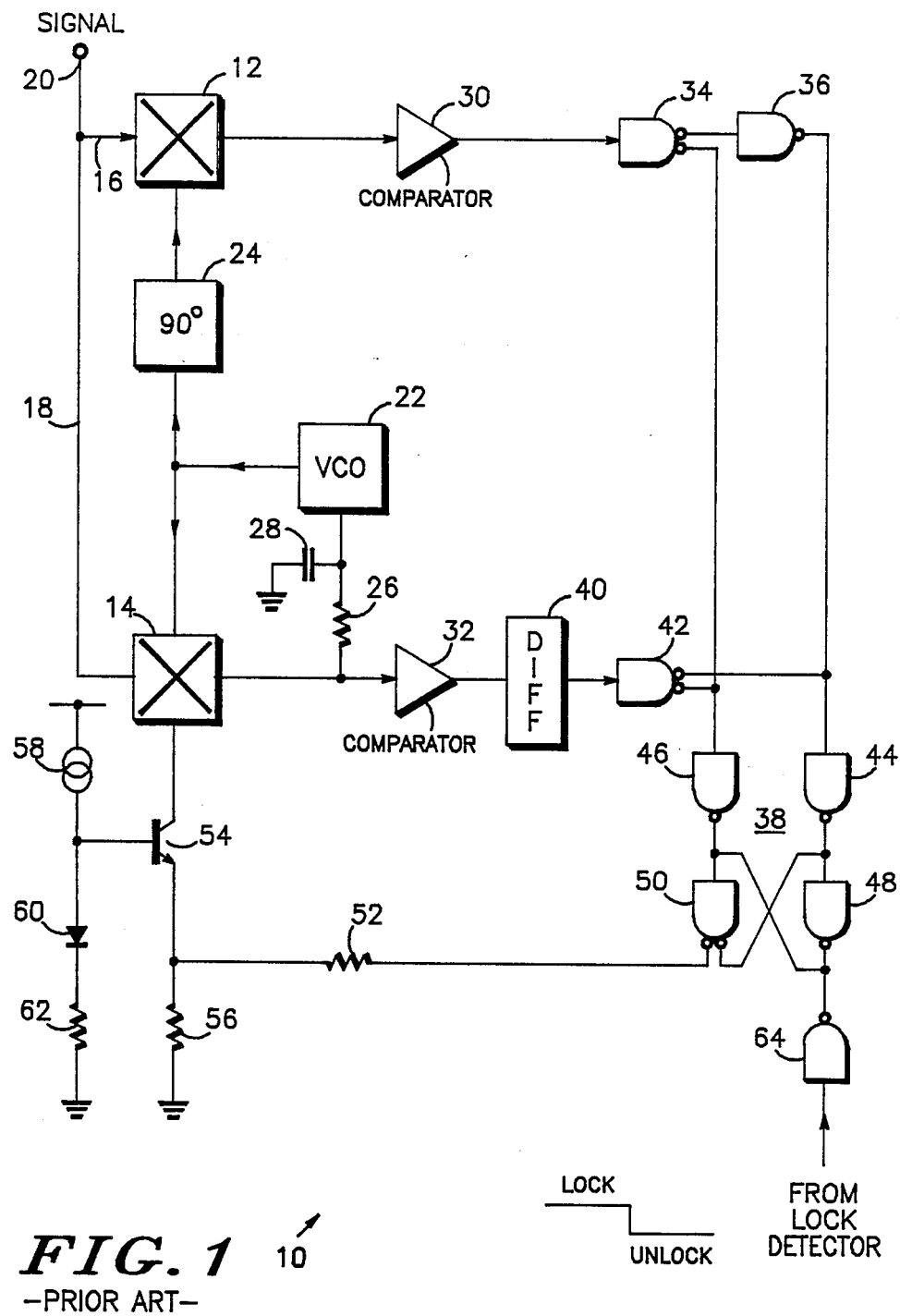
FIG. 1 is a partial schematic and block diagram illustrating a prior art PLL system.

Turning now to FIG. 1 there is illustrated prior art PLL 10 which includes circuit means for reducing the acquisition lock up time of the system. PLL 10 is utilized in the aforementioned MC13020 AM Stereo Decoder Integrated Circuit. PLL 10 includes a pair of phase detectors 12 and 14 which receive an input alternating signal via leads 16 and 18 that is applied at input 20. Voltage controlled oscillator (VCO) 22 provides an oscillating signal to each of the detectors 12 and 14. The output signal from VCO 22 is directly supplied to detector 14 and is supplied to detector 12 via ninety degree phase shifter 24. Hence the two phase detectors are operated in phase quadrature with respect to one another whereby the output phase currents are also in phase quadrature. A low pass filter comprising resistor 26 and capacitor 28 is connected between the output of detector 14 and the control input of VCO 22 for providing a DC control voltage for controlling the frequency of the output signal of VCO 22 as understood.

Phase detector 12 is operated in phase with the input signal applied at input 16 while phase detector 14 is operated in quadrature therewith. The output signals from the respective phase detectors 12 and 14 appear as beat notes (when PLL 10 is not in lock and an input signal is applied) and are applied to pulse shaping comparators 30 and 32 respectively. Comparators 30 and 32 produce rectangular output pulses at respective outputs such that the output pulse from comparator 32 is in phase quadrature with respect to the output pulse from comparator 30. The output of comparator 30 is coupled to the input of NAND gate 34 which has a pair of outputs respectively coupled to the inputs of NAND gate 36 and a first input of RS latch 38. The output of NAND gate 36 is coupled to a second input of RS latch 38. The output phase current of quadrature phase detector 32 is differentiated by differentiator 40 and then applied to the input of NAND gate 42. The outputs of NAND gate 42 are respectively coupled to the first and second inputs of RS latch 38.

RS latch 38, which is conventional in structure, comprises interconnected NAND gates 44, 46, 48, and 50 with the inputs of NAND gates 44 and 46 being coupled to the first and second inputs of RS latch 38 respectively. The output of RS latch 38 is provided at the one output of NAND gate 50 and is coupled via resistor 52 to the emitter of NPN transistor 54. The collector-emitter conduction path of transistor 54 is coupled between phase detector 14 and ground reference potential, via resistor 56, and controls the gain of the detector as its conduction is varied. The base of transistor 54 is coupled to the interconnection between current source 58 and diode 60. Diode 60 is series connected with resistor 62 between current supply 58 and ground potential. Transistor 54 and diode 62 form a well known current mirror arrangement such that the former is biased to conduct a quiescent current.

In operation, the output phase current beat notes produced at the outputs of in-phase and quadrature phase detectors 12 and 14 are used to produce a square wave output from RS latch 38 that is supplied to the emitter of transistor 54. This square wave is out of phase with the beat note signal produced at the output of quadrature phase detector 14 whenever the frequency of the input signal is greater than the signal frequency of VCO 22 and is in-phase with the beat note whenever the input signal frequency is less than the signal frequency of VCO 22. In this manner the gain of phase detector 14 is varied by varying the conductivity of transistor 54 to, in turn, either increase the positive or negative half cycle of the output phase current from the detector. As a result, the DC component of the phase current that is applied to VCO 22 is enhanced in such a wa to drive the VCO frequency towards lock up. Enhancing the correct half cycle of the phase current decreases the lock up time and enables PLL 10 to lock up even when the input signal frequency is well outside the loop bandwidth. The lock up circuit comprising comparators 30 and 32 as well as RS latch 38, differentiator 40 and gates 34, 36 and 42 is disabled when the loop locks up by disabling means. This disabling means comprising NAND gate 64 is responsive to a lock signal supplied to terminal 66 when lock up occurs to disable the output of RS latch 38 accordingly.

Despite being a definite improvement over some prior art systems PLL 10 still has limitations. The increase of phase detector gain described above and, hence, the subsequent decrease in acquisition time is still limited by loop stability considerations Moreover, as is seen in FIG. 1, the circuit paths from the two phase detectors to the input of the RS latch are dissimilar which produces different propagation delays therebetween. This fact sets a limit to the maximum error in the frequency between the input signal and the VCO signal which is undesirable.

Figure 2:
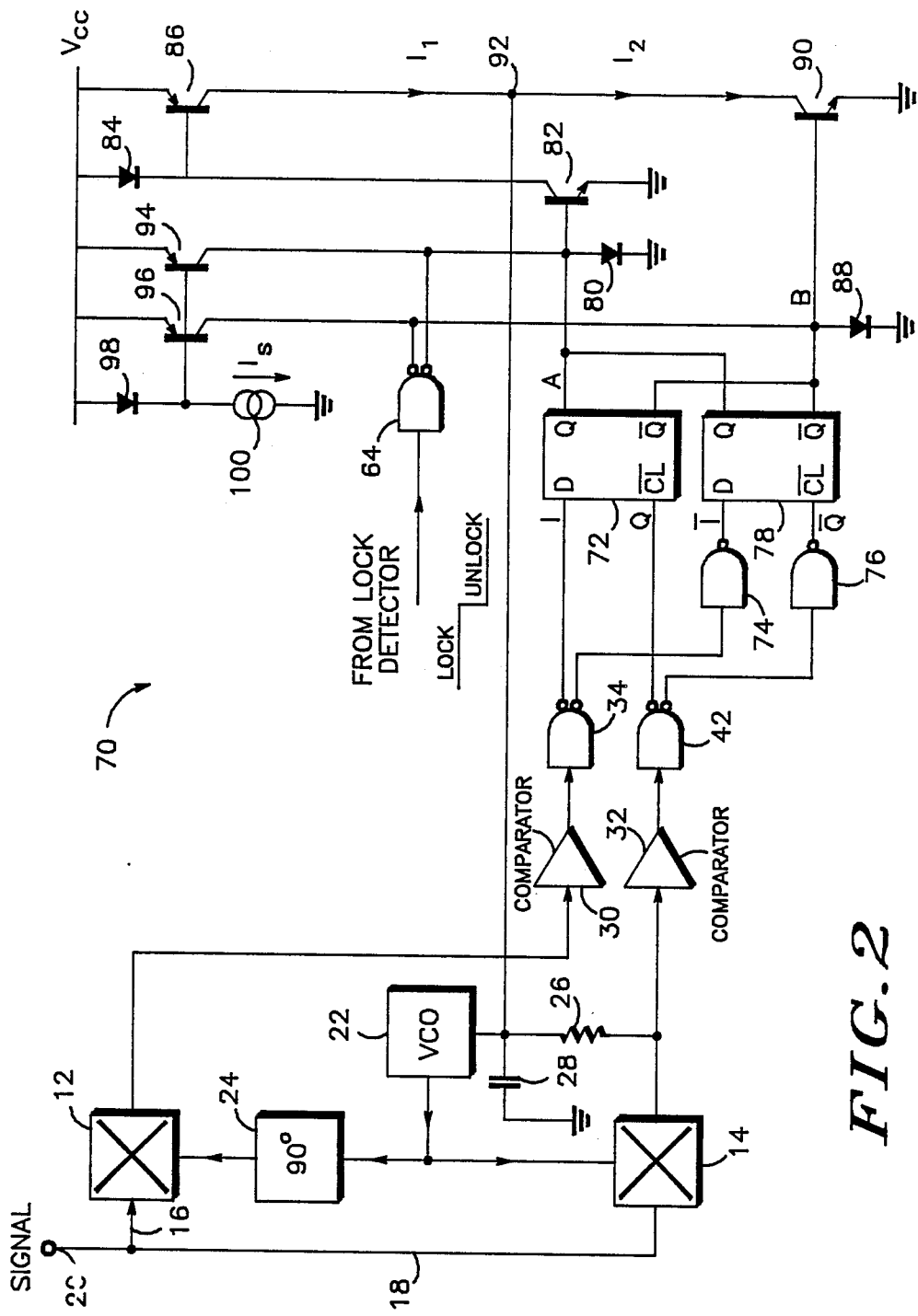
FIG. 2 is a partial schematic and block diagram illustrating the PLL system of the preferred embodiment.

Referring now to FIG. 2 there is shown PLL 70 which overcomes the problems associated with PLL 10 of FIG. 1. It is understood that PLL 70 is suited to be manufactured in integrated circuit form. Further, those components of FIG. 2 which correspond to like components of FIG. 1 are designated by the same reference numbers.

As illustrated, PLL 70 comprises phase detectors 12 and 14 as well as VCO 22, phase shifter 24, comparators 30, 32 and the low pass filter connected to VCO 22 as previously described in relation to PLL 10. The operation of this portion of the loop is the same as previously described. Hence, with PLL 70 out of lock and a signal applied to input terminal 20 beat note frequencies appear at the outputs of detectors 12 and 14 which are in quadrature phase relationship. These output phase current signals are applied to pulse shaping comparators 30 and 32 which produce a pair of rectangular or square wave output pulses that are in phase quadrature just as previously described.

The output of comparator 30 is applied to NAND gate 34 having a pair of outputs connected respectively to the data (D) input of D-type flip flop 72 and the input of NAND gate 74. Similarly, the output of comparator 32 is connected to the input of NAND gate 42 having a pair of outputs respectively connected to the clock input of flip flop 72 and NAND gate 76. The output of NAND gate 74 is coupled to the data input of D-type flip flop 78 while the output of NAND gate 76 is connected to the clock input of flip flop 78. The Q outputs of flip flops 72 and 78 are wired together to the input of a first current source means. The Q outputs of flip flops 72 and 78 are likewise wired to the input of a second current source means. The first current source means includes diode means 80 coupled across the base and emitter of NPN transistor 82 thereby forming a well known current mirror. The collector of transistor 82 is coupled to a second current mirror comprising diode means 84 and PNP transistor 86. The second current source means includes a similar current mirror arrangement comprising diode means 88 coupled across the base and emitter of NPN transistor 90 with the collector of the transistor 90 coupled at node 92 to the collector of transistor 86. Node 92 is connected to the control input of VCO 22. An additional current source provides a pair of output currents which drive the first and second current sources when PLL 70 is out of lock as will be described later. This second current source includes PNP transistors 94 and 96 interconnected with diode 98 and constant current supply 100 in a well known arrangement to supply currents at the collectors of the two transistors that are proportional to Is. NAND gate 64 is responsive to a lock indicating signal for either enabling the first and second current source means or disabling the same as described previously.

Figure 3:
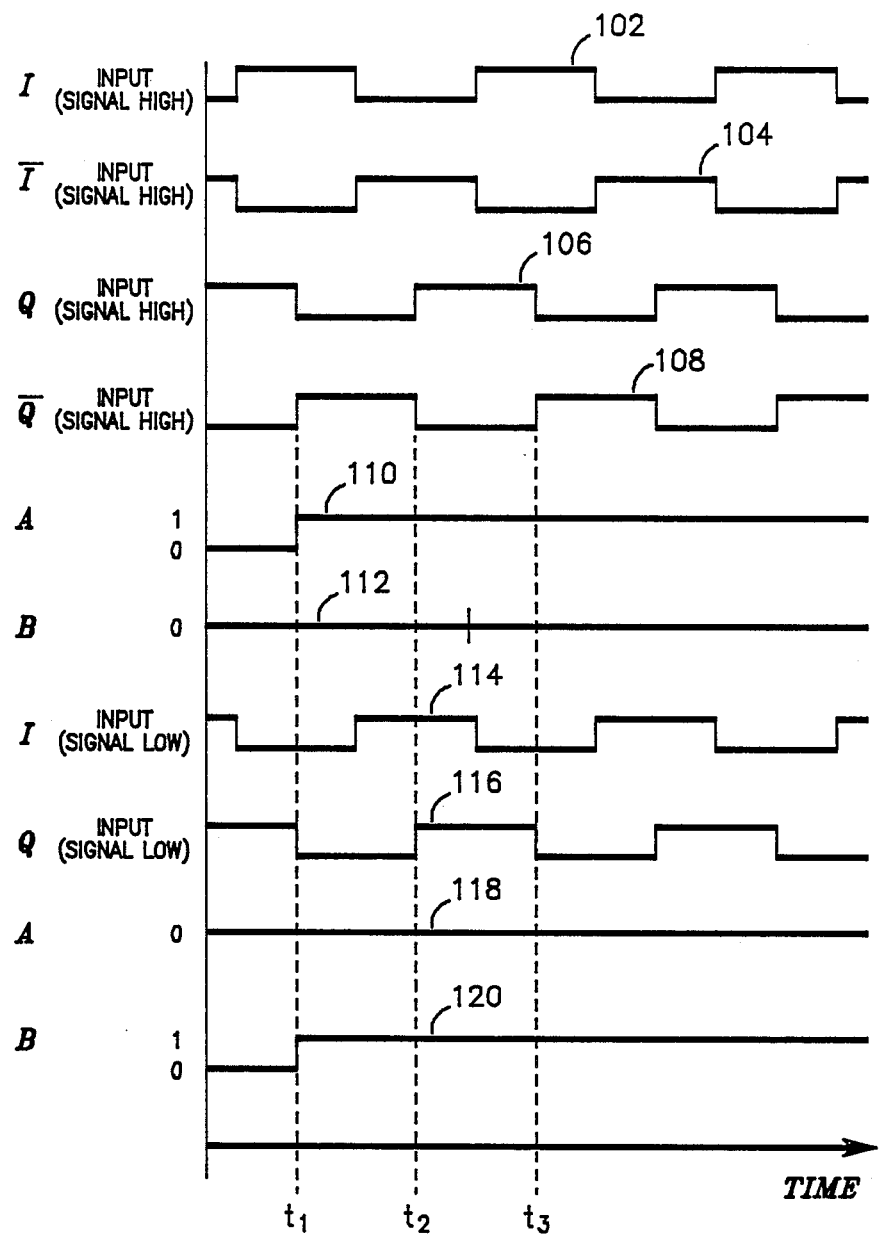
FIG. 3 is a timing diagram useful for understanding the operation of the PLL system of FIG. 2.

The operation of PLL 70 will now be described with reference to the timing diagrams of FIG. 3. It is assumed, for discussion purposes, that PLL 70 has been operating in a momentary unlocked condition with the input signal being higher in frequency than the oscillation frequency of VCO 22. In this condition the squared beat note signals applied to the data and clock inputs of flip flop 72 at lines I and Q appear as shown by waveforms 102 and 106 and are in phase quadrature relationship. The complementary beat notes are applied to the data and clock inputs of flip flop 78 on lines I and Q (waveforms 104 and 108). At time t1, in response to the waveform 106 switching from a high logic state to a low logic state the Q output of flip flop 72 is switched to a high logic level. This permits the current from transistor 94 to be sunk by diode 80 which renders transistor 82 conductive to sink current from diode 84. Transistor 86 is thus turned on to source current to node 92 which drives the control input of VCO 22 in such a manner as to drive PLL 70 towards lock up. Simultaneously, the $\bar{Q}$ output of flip flop 72 is in a low logic level and sinks the current sourced from transistor 96. Hence, diode 88 and transistor 90 are rendered non-conductive as line B is at a low level. At time t2 when the clock input to flip flop 78 switches from a high logic level to a low level state (waveform 108) the data input is at a high logic level (waveform 104) thereby clocking the Q output of the flip flop to a high output state while the $\bar{Q}$ output is clocked to a low state. Hence lines A and B remain in a high and low state. Concurrently, at time t2, the Q and $\bar{Q}$ outputs of flip flop 72 remain in a high and low state as the flip flop is non-responsive to the positive going edge of the clock signal applied thereto. At time t3 the high logic level state of data input signal (waveform 102) is transferred to the Q output of flip flop 72 in response to the negative going edge of clocking signal Q (waveform 106). The Q and $\bar{Q}$ outputs of flip flop 78 remain unchanged. Thus, the control input of VCO 22 is driven by the current sourced from transistor 86 in such a manner as to drive the oscillation frequency towards the input signal frequency and, hence, PLL 70 to a lock condition. The reverse states are true if the input signal frequency is lower than oscillation frequency of VCO 22. As can be seen from waveforms 114, 116, 118 and 120, whenever the clock input signal to flip flop 72 switches negatively the data input signal on line I will be low thereby keeping lines A and B in a low and high level state. In this condition diode 88 and transistor 90 are rendered conductive while transistor 86 is turned off. Transistor 90 will therefore sink a current I2 from node 92. The control input of VCO 22 is thus driven in such a manner that the oscillation signal frequency is lowered until lock occurs. Upon lock up, the input to disabling means 64 goes high forcing the output low thereby disabling the first and second current sources and switching off both I1 and I2. PLL 70 then maintains lock until the input signal frequency changes to cause the system to go out of lock. Thus the lock up circuit portion of PLL 70 comprising flip flops 72 and 78 as well as the two current sources provides an indication of the relative phase of the beat note frequencies appearing on lines I and Q by either sourcing current to or from node 92 as the input signal frequency varies above or below the VCO 22 frequency. This is due to the fact that the signal appearing on line I switches by one hundred eighty degrees with respect to the beat note signal appearing on line Q.

It is seen from FIG. 2 that the signal paths from phase detectors 12 and 14 to the lock up circuit are substantially the same. Hence, signal delays to the data and clock inputs of the two flip flops 72 and 78 are the same. Thus, the only frequency limitations to the PLL system is the clock frequency of the two flip flops unlike that of the prior art PLL illustrated in FIG. 1. Noise immunity is provided by the use of the two flip flops 72 and 78 since both zero crossings of the Q signal (waveform 106) are utilized.

Hence, what has been described above is a novel PLL system including lock-up circuitry for driving the VCO of the system towards lock. By utilizing a pair of flip flops and current sources the PLL is made wideband and provides good noise immunity.

I claim:

1. Circuit responsive to a pair of applied input signals for providing an output signal at a circuit output indicative of the phase relation between the pair of input signals, comprising:
   a D-type flip flop having data and clock inputs to which the pair of input signals are respectively applied and first and second outputs at which are provided complementary output logic signals
   first current source means coupled between said first output of said D-type flip flop and the circuit output for sourcing current to said circuit output when rendered conductive by said logic output signal being in a first level state and being rendered non-conductive in response to said logic output signal being in a second level state; and
   second current source means coupled between said second output of said D-type flip flop and the circuit output for sinking a current therefrom when rendered conductive by said logic output signal being in said first level state and being rendered non-conductive in response to said output logic signal being in said second level state.

2. The circuit of claim 1 wherein said first current source means includes:
   first current supply means for providing a first current;
   first current mirror means having an input coupled both to said first current supply means and said first output of said D-type flip flop and an output for sinking a current at said output responsive to first current being supplied thereto; and
   second current mirror means having an input coupled to said output of said first current mirror means and an output coupled to the circuit output for sourcing current thereto responsive to said first current mirror means.

3. The circuit of claim 1 wherein said second current source means includes:
   current supply means for supplying a current at an output thereof;
   current mirror means having an input coupled both to said second output of the D-type flip flop and said output of said current supply means responsive to said current sourced thereto for sinking a current at an output thereof which is coupled to the circuit output.

4. The circuit of claim 2 wherein said second current source means includes:
   a second current supply means for sourcing a current at an output;
   third current mirror means having an input coupled both to said second output of said D-type flip flop and said output of said second current supply means and an output, said third current mirror means being responsive to said current being sourced to said input for sinking a current at said output, said output being coupled to the circuit output.

5. The circuit of claim 4 including:
   inverter means receiving said pair of input signals for providing the complements of said pair of input signals at respective outputs; and an additional D-type flip flop having clock and data inputs to which said output signals from said inverter means are respectively applied and first and second outputs at which complementary output logic signals are provided, said first output being coupled to said first output of said D-type flip flop and said second output being coupled to said second output of said D-type flip flop.

6. A phase locked loop including a pair of phase detectors operated in phase quadrature for providing a pair of output error signals whenever the frequency of an applied input signal differs from the oscillation frequency of a voltage controlled oscillator (VCO) having an output coupled to the phase detectors and a control input terminal, and circuit means responsive to the error signals for driving the oscillation frequency toward the input signal frequency, the improvement including the circuit means comprising:

a first flip flop having data and clock input terminals to which the error signals are respectively supplied and first and second output at which are provided first and second complementary output logic signals;

first current source means coupled between said first output of said first flip flop and the control input terminal of the VCO for sourcing a current thereto in response to said first logic output signal being in a first logic level state whenever the input signal frequency is greater than the VCO frequency; and second current source means coupled between said second output of said first flip flop and said control input terminal of the VCO for sinking a current therefrom in response to said second logic output signal being in said first logic level state whenever the input signal frequency is less than the VCO frequency.

7. The PLL of claim 6 wherein the circuit means includes:

inverter means receiving the error signals for providing the complementary thereof at respective outputs; and a second flip flop having data and clock input terminals to which the complementary error signals are supplied and first and second outputs at which complementary output logic signals are provided, said first output being coupled to said first output of said first flip flop and said second output being coupled to said second output of said first flip flop.

8. The PLL of claim 7 wherein said first current source means includes:

first current supply means for sourcing a first current at an output;

first current mirror means having an input coupled both to said output of said first current supply means and said first output of said first flip flop and an output for sinking current at said output responsive to said first current being supplied thereto and said first logic output signal from said first flip flop being in said first logic level state; and second current mirror means having an input coupled to said output of said first current mirror means and an output coupled to said control input terminal of the VCO for sourcing current thereto responsive to said first current mirror means.

9. The PLL of claim 8 wherein said second current source includes:

second current supply means for sourcing a second current at an output; and third current mirror means having an input coupled both to said second output of said first flip flop and said output of said second current supply means and an output coupled to said control input terminal of the VCO for sinking current therefrom responsive to said second current and said second logic output signal being in said first logic level state.

10. The circuit of claim 9 wherein said first and second flip flops are D-type flip flops.

* * * * *